(12) United States Patent
Chang et al.

(10) Patent No.: US 6,469,390 B2
(45) Date of Patent: *Oct. 22, 2002

(54) DEVICE COMPRISING THERMALLY STABLE, LOW DIELECTRIC CONSTANT MATERIAL

(75) Inventors: Chorng-Ping Chang, Berkeley Heights, NJ (US); Kin Ping Cheung, Hoboken, NJ (US); Chien-Shing Pai, Bridgewater, NJ (US); Wei Zhu, Warren, NJ (US)

(73) Assignee: Agere Systems Guardian Corp., Orlando, FL (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/296,001

(22) Filed: Apr. 21, 1999

(65) Prior Publication Data

US 2002/0000669 A1 Jan. 3, 2002

Related U.S. Application Data

(60) Provisional application No. 60/117,242, filed on Jan. 26, 1999.

(51) Int. Cl.[7] .......................... H01L 23/48; H01L 23/52; H01L 29/40; H01L 23/58
(52) U.S. Cl. ........................ 257/758; 257/752; 257/759; 257/642; 257/637
(58) Field of Search ................................ 257/758, 752, 257/759, 642, 637

(56) References Cited

U.S. PATENT DOCUMENTS

| | | |
|---|---|---|
| 4,222,792 A | 9/1980 | Lever et al. |
| 5,217,920 A | 6/1993 | Mattox et al. |
| 5,470,802 A | 11/1995 | Gnade et al. |
| 5,548,159 A | 8/1996 | Jeng |
| 5,668,398 A | 9/1997 | Havemann et al. |
| 5,750,415 A | 5/1998 | Gnade et al. |
| 5,751,056 A | 5/1998 | Numata |
| 5,751,066 A | 5/1998 | Havemann |

OTHER PUBLICATIONS

MRS Symposium Proceedings on Low Dielectric Constant Materials, vols. 381, 443, 476, 511, (1995–1998).
MRS Bulletin on Low Dielectric Constant Materials, vol. 22, (1997).
P. Singer, "Low k dielectircs: the search continues," *Semiconductor International*, 64 (1998).
L. Peters, "Pursuing the perfect low–k dielectric", *Semiconductor International*, 64 (1998).
T. Ramos et al., "Nanoporous silica for low k dielectrics," *MRS. Symp. Proceedings on Low Dielectric Constant Materials*, vol. 443, 91 (1997).
E. D. Birdsell, et al., "Porous silica: a potential material for low dielectric constant applications," *MRS Symp. Proceedings on Low Dielectric Constant Materials*, vol. 511, 111 (1998).
L.W. Hurbesh, et al., "Processing and characterization of high porosity aerogel films," *MRS. Symp. Proceedings on Advances in Porous Materials*, vol. 371, 195 (1995).

Primary Examiner—Eddie Lee
Assistant Examiner—Jesse A. Fenty
(74) Attorney, Agent, or Firm—Scott Rittman

(57) ABSTRACT

It has been discovered that for semiconductor devices such as MOSFETs, there is significant capacitive coupling in the front-end structure, i.e., the structure from and including the device substrate up to the first metal interconnect level. The invention therefore provides a device comprising a silicon substrate, an isolation structure in the substrate (e.g., shallow trench isolation), an active device structure (e.g., a transistor structure), a dielectric layer over the active device structure, and a metal interconnect layer over the dielectric layer (metal-1 level). At least one of the dielectric components of the front-end structure comprise a material exhibiting a dielectric constant less than 3.5. This relatively low dielectric constant material reduces capacitive coupling in the front-end structure, thereby providing improved properties in the device.

19 Claims, 2 Drawing Sheets

DEVICE COMPRISING THERMALLY STABLE, LOW DIELECTRIC CONSTANT MATERIAL

CROSS-REFERENCE TO RELATED APPLICATION

This application claims priority of Provisional Application Ser. No. 60/117242, which was filed Jan. 26, 1999.

BACKGROUND OF THE INVENTION

1. Field of the Invention

The invention relates to the use of low dielectric constant (κ) materials for device fabrication, in particular ultra-large scale integration (ULSI) devices.

2. Discussion of the Related Art

For semiconductor devices, packing densities quadruple, and minimum circuit dimensions shrink by 70%, about every three years. The design rules for such packing density and circuit dimension require an increase in the number of metal interconnect levels and the reduction of metal pitch (i.e., the linewidth and spacing between adjacent metal lines). However, tightening the metal pitch design rule increases both the line resistance and the capacitance between metal lines. Specifically, a large portion of the capacitive coupling is found in the back-end structure—between metal interconnects on the same level and between metal interconnects on different levels. The resulting increase in resistance-capacitance (RC) coupling undesirably increases propagation delay, increases cross-talk noise and increases power dissipation. Moreover, this capacitance is even more problematic because the metal height generally cannot be scaled down with the width due to reliability concerns.

As a result of these problems, low dielectric constant (i.e., low κ) materials have been widely proposed and designed for use in back-end multi-level interconnect architecture, to reduce such interlayer and intralayer capacitance. See, e.g., *MRS Symposium Proceedings on Low Dielectric Constant Materials*, Vols. 381, 443, 476, 511, 1995–1998; *MRS Bulletin on Low Dielectric Constant Materials*, Vol. 22 (1997); P. Singer, "Low κ dielectrics: the search continues," *Semiconductor International*, 88 (May 1996); L. Peters, "Pursuing the perfect low-κ dielectric," *Semiconductor International*, 64 (September 1998). These back-end low κ materials have been useful in reducing undesired capacitance, but improved materials and techniques for improving the properties of shrinking devices are continually desired.

SUMMARY OF THE INVENTION

It has been discovered that, in addition to the capacitive coupling arising from the back-end structure, there is substantial capacitive coupling in the front-end structure of semiconductor devices. By providing low κ material capable of withstanding the harsher requirements of front-end fabrication, significant performance enhancement is attained. (The front-end structure, as known in the art, is the structure from and including the device substrate up to the first metal interconnect level (metal-1); the back-end structure is the structure including the first metal interconnect layer and above).

A typical semiconductor device according to the invention, reflected in FIG. 1, includes a substrate 12, an isolation structure in the substrate (e.g., shallow trench isolation 10), an active device structure (e.g., a transistor structure 14, 16, 18, 19, 20), a dielectric layer 26 over the active device structure, and a metal interconnect layer 28 over the dielectric layer (metal-1 level). At least one of the isolation structure 10 and the dielectric layer 26—which are dielectric material components in the front-end structure—comprise a material exhibiting a dielectric constant less than 3.5. This relatively low dielectric constant provides improved properties in the overall device by reducing capacitive coupling in the front-end.

It is not possible, however, to simply use low κ materials designed for a back-end structure. Low κ materials suitable for integration in the front-end structure must meet a different set of physical and chemical requirements. In particular, the thermal stability requirement for front-end low κ materials is much higher, typically at least 700° C., and as high as 1000° C. By contrast, typical back-end low κ materials such as organic or inorganic polymers generally are designed to endure only relatively low temperatures, e.g., up to 425° C., and will not withstand front-end processing temperatures. In one embodiment of the invention, therefore, a high thermal stability porous silica is used to provide a dielectric constant less than 3.5, advantageously less than 3.0, in the front-end structure of semiconductor devices. The silica is capable of exhibiting a thermal stability of at least 700° C., optionally at least 1000° C. (Thermal stability indicates less than 5 wt.% loss at the noted temperature.)

DETAILED DESCRIPTION OF THE INVENTION

The invention provides a device comprising a substrate (generally silicon, gallium arsenide, or silicon-on-insulator), an isolation structure in the substrate (e.g., shallow trench isolation), an active device structure (e.g., a transistor structure), a dielectric layer over the active device structure, and a metal interconnect layer over the dielectric layer (metal-1 level). At least one of the isolation structure and the dielectric layer contain a material exhibiting a dielectric constant less than 3.5, advantageously less than 3.0.

Figure 1:
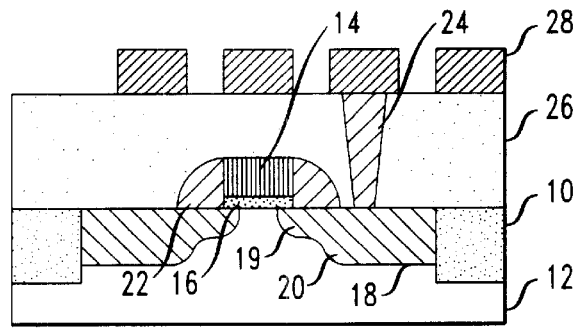
FIG. 1 illustrates a typical MOSFET device structure.

The basic architecture of a common silicon semiconductor device—a metal-oxide-silicon field effect transistor (MOSFET)—is presented in FIG. 1. The isolation between devices is provided by an isolation structure 10. This isolation structure 10 is typically formed by patterning trenches into a silicon substrate 12 and filling the trenches with an insulating material such as silicon dioxide (known as shallow trench isolation). Additional processes remove the insulating material from the areas of the silicon 12 surface where MOSFET devices are to be formed. A variety of structures are capable of providing such isolation, with shallow trench isolation being the most common for deep sub-micron (<0.35 μm) devices.

The active device structure (i.e., the components in which the desired electrical activity occurs)—in this case a transistor—contains a gate conductor 14 typically formed from polysilicon, a gate dielectric 16, and a gate junction 18. As known in the art, the junction 18 is generally formed by doping the silicon with either n-type (e.g. phosphorus) or p-type (e.g. boron) impurities and activating them with high temperature (>900° C.) anneal. For improved device performance and reliability, the junction generally consists of two regions: a lightly doped region 19 next to the transistor channel and under the gate dielectric, and a more heavily doped region 20. The most common way to produce two regions is to use an insulating spacer 22. Specifically, a light-dose (e.g., $10^{13}$–$10^{14}$ cm$^{-2}$) ion implantation is performed after the gate definition. Then, the spacer 22 is formed by depositing and then etching an insulating material. Heavier-dose (>$10^{15}$ cm$^{-2}$) ion implantation is then performed, with the spacer 22 protecting the lightly doped region from this second implantation.

To isolate devices from metal wiring, a layer of insulating material 26 is deposited over the active device, this layer 26 generally referred to as dielectric-1 (D-1). To connect the active device to external voltage supply and signals, contact holes are patterned into the dielectric-1 layer 26, and metal wiring 24 is provided in the contact holes, the wiring 24 in contact with a metal interconnect layer 28. Typically, multiple levels of metal interconnect, e.g., 5–7 levels, are used, with insulating material between each level. The structure from the substrate 12 up to the first metal interconnect level 28 is referred to as the front-end structure.

Figure 2:
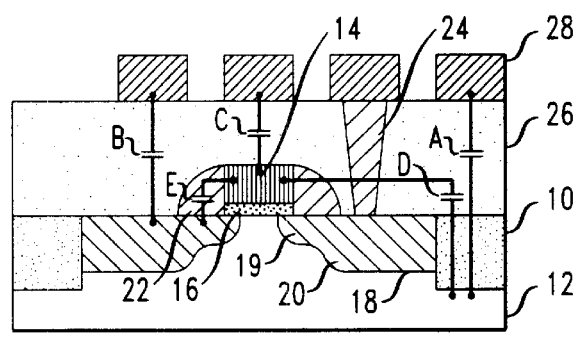
FIG. 2 illustrates the capacitive coupling exhibited by a MOSFET structure such as illustrated in FIG. 1.

FIG. 2 illustrates different types of capacitive coupling that exist in the front-end structure of a MOSFET device as shown in FIG. 1. These couplings include: (A) first metal wiring (Metal-1) to silicon substrate, (B) Metal-1 to junctions, (C) Metal-1 to gate, (D) gate to silicon substrate, and (E) gate to adjacent junctions. Using low κ material in the dielectric layer 26, the isolation structure 10, and the spacer 22 is effective in reducing these couplings. Specifically, in the case of coupling (A), the coupling is affected by dielectric layer 26 (D-1) and the isolation structure 10. For couplings (B) and (C), only D-1 has an effect. For capacitive coupling (D), only the isolation structure 10 has an effect. In the case of coupling (E), the spacer 22 plays an important role. The gate insulator 16 is required to provide a strong capacitive coupling between the gate and the transistor channel for effective ULSI device operation. Therefore, low κ material is generally not suitable for the gate insulator.

As reflected in the Example below, it has been found that the capacitance of these couplings is capable of being reduced by providing materials with relatively low dielectric constant (κ<3.5) in the front-end structure, e.g., for the spacer 22, the dielectric-1 level 26, and the isolation structure 10. And, by reducing the capacitance, the overall device exhibits improved properties. In fact, using low κ material in the front-end structure is more effective in improving performance than using such low κ material in the back-end structure.

As mentioned above, however, because the front-end fabrication experiences higher temperatures—as high as 1000° C.—the low dielectric constant material must exhibit high thermal stability. Porous inorganic materials have been found to be useful because the κ value derives from a combination of that of air (~1) and of a high thermal stability solid phase. The low κ material is thermally stable (weight loss <5%) at the requisite temperature, typically 700 to 1000° C., depending on the particular area of incorporation.

For example, the dielectric layer (D-1) typically experiences temperatures of up to 700° C., the spacer up to 800° C., and the isolation structure up to 1000° C. The porosity and the surrounding structure advantageously remain nearly constant during the processing, without substantial pore collapse or pore growth. Suitable materials include ceramics such as silica and alumina. Other materials such as porous diamond-like-carbon (DLC) and some thermosetting polymers are also contemplated.

The average pore size is generally much smaller than microelectronics feature sizes. The porosity is typically in the range 10 to 90 vol. %, advantageously 10–60 vol. %, in order to provide a low κ value, while at the same time provide sufficient mechanical strength. The dielectric constant is advantageously below 3.5, more advantageously below 3.0. The pore size is advantageously less than 25 nm, more advantageously less than 15 nm. In addition, a narrow pore size distribution is desired, advantageously such that the tail of large pore sizes terminates below 25 nm.

Porous silica is useful for several reasons. Specifically, silica is a commonly-used dielectric material and porous silica fabrication techniques employ precursors similar to those used for conventional silica deposition, e.g., spin on glass (SOG) and chemical vapor deposition (CVD). Porous silica is generally classified as either an aerogel (dried supercritically, containing >75% voids) or a xerogel (dried by solvent evaporation, containing <75% voids). Both types of porous silica are referred to herein as nanoporous silica (NPS). In addition to exhibiting a low κ, NPS is capable of being formed such that it exhibits a thermal stability up to 1000° C. NPS also offers small pore sizes (less than the size of microelectronics features), is capable of deposition using similar tools as employed for conventional SOG processing, and offers the ability to tune dielectric constant over a wide range by varying porosity.

It is possible to form the NPS low κ material by any suitable technique. Typically, the NPS is fabricated by solution sol gel or colloidal sol gel techniques, using, for example, spin-on coating processes. The solution sol gel technique typically involves the use of precursors such as alkoxysilanes, in particular tetraethoxysilane (TEOS), and alkylalkoxysilanes, in particular methyltriethoxysilane (MTEOS). See, e.g., T. Ramos et al., "Nanoporous silica for low κ dielectrics," *MRS Symp. Proceedings on Low Dielectric Constant Materials*, Vol. 443, 91 (1997). The porosity is created by allowing the precursor films to gel (i.e. cross-link to yield a continuous solid network spanning the entire fluid) before drying, such that removal of the water leaves air-filled pores. Gelation occurs after precursor deposition either as a result of changes in the precursor immediately before deposition (temperature, pH, catalyst, etc.), as a result of a catalyst added after deposition, or by evaporation after deposition. Chemical and processing considerations include precursor chemistry, control of solvent evaporation, aging to maximize film strength, and preventing shrinkage during drying.

Various colloidal sol gel processes are possible. One process involves the use of colloidal silica and potassium silicate. See, e.g., E. D. Birdsell and R. A. Gerhardt, "Porous silica: a potential material for low dielectric constant applications," *MRS Symp. Proceedings on Low Dielectric Constant Materials*, Vol. 511, 111 (1998). The precursors are combined with a gelling agent such as formamide, and mixed at room temperature. After deposition, e.g., by spin coating, the films are typically gelled in normal atmospheric conditions, leached with deionized water to remove the remnant alkali ions, air dried and then baked. Important process parameters include the spin speed, precursor mixing time, gelation time, and gel composition (ratio of colloidal silica to potassium silicate).

Other techniques for fabricating porous materials known in the art are also suitable.

Aerogels are typically made by such sol gel techniques, but involve formation of solvent-filled gels which are dried using special conditions to preserve the solid network. Preparation of high porosity aerogel films is known in the art, as reflected, for example, in L. W. Hrubesh and J. F. Poco, "Processing and characterization of high porosity aerogel films," *MRS Symp. Proceedings on Advances in Porous Materials*, Vol. 371, 195 (1995). Aerogels often have extremely high porosity, however, which creates the potential for reduced strength.

Sol gel processes are easily adapted to deposit porous material such as NPS (xerogel and/or aerogel) into the front-end structure of a semiconductor device. A typical front-end fabrication process (from silicon substrate to metal-1) involves approximately 250 steps, as known in the art. Optional steps involving deposition of low κ front-end materials include the following. The shallow isolation trench is capable of being filled by spinning-on silica sol. After gelation, the trench material is typically polished via CMP (chemical-mechanical polishing) to the level of the substrate surface. After a series of steps involving photolithography, ion implantation and gate definition, the spacer dielectric is formed by spinning-on silica sol and gelling the material, followed by anisotropic etch. Again, after curing and a series of steps involving junction formation, dielectric-1 is deposited by spinning-on silica sol, followed by gelling and CMP to planarize the dielectric-1. Steps of forming windows in dielectric-1 as well as metal-1 formation follow.

It is also possible to use other techniques known in the art for forming and depositing insulating materials meeting the thermal, mechanical, and dielectric requirements of the invention.

The invention will be further clarified by the following example.

EXAMPLE

To show the relative contributions to overall device performance of the capacitive sources present in FIG. 2, a circuit simulation using different dielectric structures was performed using a TCAD simulator, ADVICE™. The circuit, a divide-by-three counter, was a standard ASIC bench-mark test circuit, and the maximum toggling frequency of the counter just prior to a functional failure was recorded. The design rule used for the circuit was based on a 0.25 μm CMOS design rule, and both the layout design rule and the circuit (poly-cell) weighted rule for poly-1 (gate conductor), metal-1 and metal-2 are listed in Table I. The weighted circuit rule was used in the simulation for capacitance extraction.

TABLE I 0.25 μm design rule and circuit averaged rule for a poly-cell divide-by-three counter layout and circuit simulation

| Level | Design Rule <line>/<space> | Poly-Cell Averaged <line>/<space> |
|---|---|---|
| P1 | 0.25 μm/0.36 μm | 0.25 μm/0.50 μm |
| M1 | 0.40 μm/0.40 μm | 0.40 μm/0.50 μm |
| M2 | 0.40 μm/0.40 μm | 0.40 μm/0.60 μm |

Figure 3:
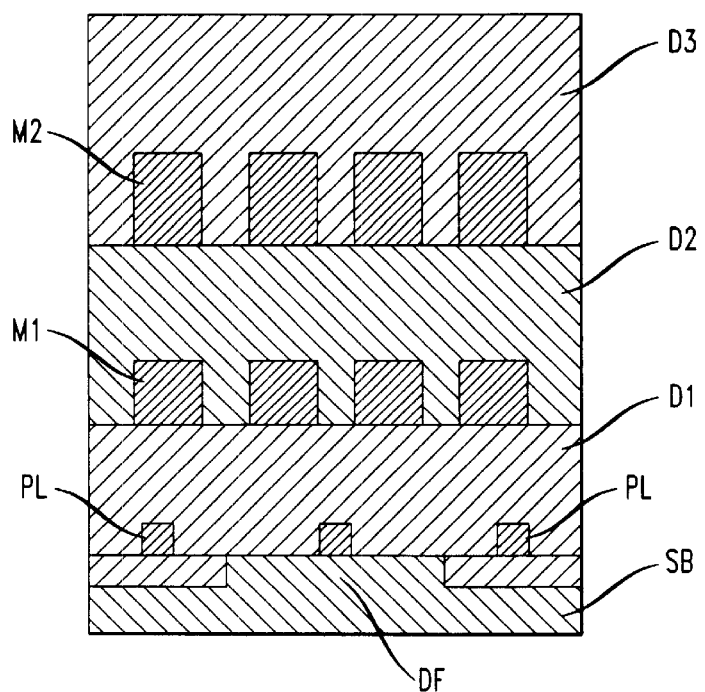
FIG. 3 illustrates the device structure used for a simulation experiment involving variation in dielectric constant values.

In the circuit simulation, all device parameters (e.g. transistors, junction) were kept constant except the capacitance value of various dielectric layers. The capacitance extraction was done using the device structure shown in FIG. 3. The structure contains a substrate (SB), a gate junction (DF), gate conductors (PL), dielectric levels 1, 2, and 3 (D1, D2, D3, respectively), and metal interconnect levels 1 and 2 (M1 and M2, respectively). The thicknesses in the devices were as follows:

height of isolation structures: 0.3 μm;

height of gate conductors (PL): 0.2 μm;

height of dielectric-1 (D1): 1.0 μm;

height of dielectric-2 (D2): 1.3 μm;

height of dielectric-3 (D3): 1.6 μm;

height of metal-1 (M1): 0.5 μm; and height of metal-2 (M2): 0.8 μm.

Three dielectric structures were used in the circuit. D44 and D22 are two dielectric systems in which the dielectric materials have a dielectric constant of 4.0 and 2.0, respectively, from D1 and up. D42 is a dielectric system using dielectric material with a dielectric constant of 2 from D2 and up.

Figure 4:
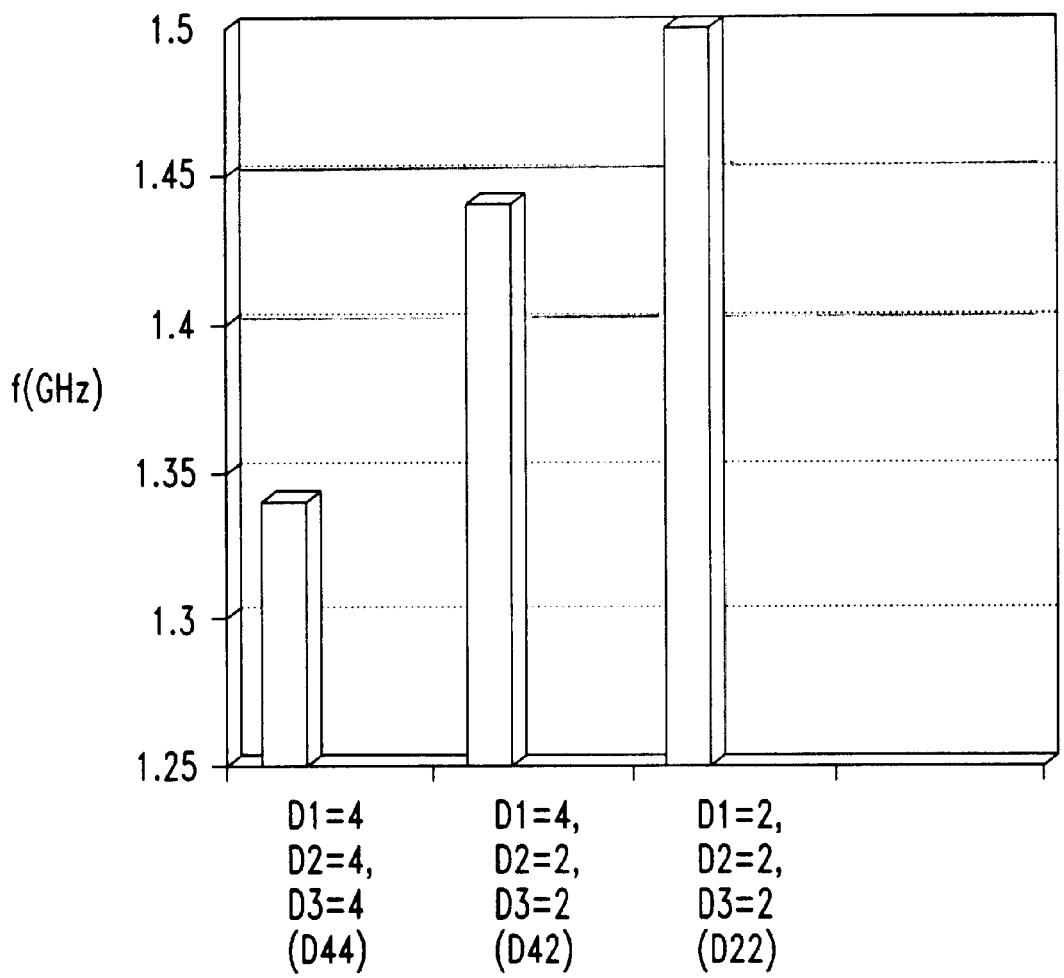
FIG. 4 illustrates the effect of providing low κ material in the front-end structure.

The extracted capacitance values from the circuit simulation are listed in Table II and illustrated in FIG. 4. Table II provides a breakdown of the capacitance contributions due to addition of low κ material into the circuit simulation one capacitive parameter at a time. Both inter-capacitance (between metal layers—in capacitance per area) and intra-capacitance (between metal lines—in capacitance per length) are listed. The simulation began from a circuit with dielectric system of D44, migrated into circuit with dielectric system of D42, and concluded at a circuit with dielectric system of D22. For each simulation, the maximum toggling frequency ($f_{max}$) for the divide-by-three counter was obtained and used as a measure of the circuit performance.

Using a low κ dielectric material, from D44 to D42 to D22, increased the maximum toggling frequency from 1.34 GHz to 1.44 GHz to 1.50 GHz, respectively, as shown in FIG. 4. It is clear from the simulation that the improvement of circuit performance is most effectively achieved by reducing the front-end capacitance (i.e., use low κ material at D1 and lower), as opposed to the back-end capacitance (low κ material at D2 and higher). Specifically, the example shows the desirable effects of reducing the capacitance of the following couplings, shown in FIG. 2: capacitance A (metal-1 to substrate—CM1 SB), B (metal-1 to junction or CM1 DF) and C (metal-1 to gate conductor or M1 PL) as well as parasitic capacitance D (gate conductor to substrate or CPLSB).

TABLE II

| | CPLSB | CM1SB | CM1DF | CM1PL | CM2SB | CM2DF | CM2PL | CM2M1 | ($f_{max}$) |
|---|---|---|---|---|---|---|---|---|---|
| D = 44 | | | | | | | | | |
| Inter | 29.36 | 5.93 | 7.59 | 9.38 | 3.35 | 3.78 | 4.10 | 10.23 | 1.34 |
| Intra | 2.99 | 6.73 | 6.53 | 6.33 | 8.01 | 7.95 | 7.90 | 7.18 | |
| | — | — | — | — | — | — | — | 5.10 | 1.34 |
| | — | — | — | — | — | — | — | 3.59 | |
| | — | — | — | — | — | — | 2.05 | 5.10 | 1.34 |
| | — | — | — | — | — | — | 3.95 | 3.59 | |
| | — | — | — | — | — | 1.88 | 2.05 | 5.10 | 1.34 |
| | — | — | — | — | — | 3.97 | 3.95 | 3.59 | |
| | — | — | — | — | 1.68 | 1.88 | 2.05 | 5.10 | 1.35 |
| | — | — | — | — | 4.00 | 3.97 | 3.95 | 3.59 | |
| | — | — | — | 9.13 | 1.68 | 1.88 | 2.05 | 5.10 | 1.37 |
| | — | — | — | 3.57 | 4.00 | 3.97 | 3.95 | 3.59 | |
| | — | — | 7.43 | 9.13 | 1.68 | 1.88 | 2.05 | 5.10 | 1.39 |
| | — | — | 3.76 | 3.57 | 4.00 | 3.97 | 3.95 | 3.59 | |
| D = 42 | | | | | | | | | |
| Inter | 29.36 | 5.80 | 7.43 | 9.13 | 1.68 | 1.88 | 2.05 | 5.10 | 1.44 |
| Intra | 2.99 | 3.96 | 3.76 | 3.57 | 4.00 | 3.97 | 3.95 | 3.59 | |
| | — | — | — | 4.67 | 1.68 | 1.88 | 2.05 | 5.10 | 1.45 |
| | — | — | — | 3.16 | 4.00 | 3.97 | 3.95 | 3.59 | |
| | — | — | 3.80 | 4.67 | 1.68 | 1.88 | 2.05 | 5.10 | 1.46 |
| | — | — | 3.26 | 3.16 | 4.00 | 3.97 | 3.95 | 3.59 | |
| | — | 2.95 | 3.80 | 4.67 | 1.68 | 1.88 | 2.05 | 5.10 | 1.48 |
| | — | 3.37 | 3.26 | 3.16 | 4.00 | 3.97 | 3.95 | 3.59 | |
| D = 22 | | | | | | | | | |
| Inter | 27.32 | 2.95 | 3.80 | 4.67 | 1.68 | 1.88 | 2.05 | 5.10 | 1.5 |
| Intra | 1.50 | 3.37 | 3.26 | 3.16 | 4.00 | 3.97 | 3.95 | 3.59 | |

Capacitance units: Inter (between levels) = E-17 (f/$\mu m^2$), Intra (between lines) = E-17 (f/$\mu m$)

Other embodiments of the invention will be apparent to those skilled in the art from consideration of the specification and practice of the invention disclosed herein.

What is claimed is:

1. A device comprising:
a front-end structure comprising a substrate, an isolation structure in the substrate, an active device structure, one or more insulating spacers located adjacent the active device structure, and a dielectric layer over the active device structure; and
a back-end structure comprising a metal interconnect layer over the dielectric layer;
wherein at least one of the isolation structure and the one or more insulating spacers comprise a material exhibiting a dielectric constant less than 3.5, and wherein the dielectric layer optionally comprises a material exhibiting a dielectric constant less than 3.5, and wherein the material exhibiting a dielectric constant less than 3.5 comprises a material exhibiting 10 to 90 vol.% porosity.

2. The device of claim 1, wherein the substrate is selected from silicon, gallium arsenide, and silicon-on-insulator.

3. The device of claim 1, wherein the active device structure comprises a gate conductor, a gate dielectric, and a gate junction.

4. The device of claim 1, wherein the material exhibits a dielectric constant less than 3.0.

5. The device of claim 1, wherein the material exhibits 10 to 60 vol.% porosity.

6. The device of claim 1, wherein the material is selected from ceramics, thermosettings polymers, and carbon materials.

7. The device of claim 6, wherein the material is silica.

8. The device of claim 1, wherein the material exhibits an average pore size less than 25 nm.

9. A device comprising:
a front-end structure comprising a substrate, an isolation structure in the substrate, an active device structure, one or more insulating spacers located adjacent the active device structure, and a dielectric layer over the active device structure; and
a back-end structure comprising a metal interconnect layer over the dielectric layer;
wherein the one or more insulating spacers optionally comprise a material exhibiting a dielectric constant less than 3.5, wherein the dielectric layer optionally comprises a material exhibiting a dielectric constant less than 3.5, and wherein the isolation structure comprises a material exhibiting a dielectric constant less than 3.5.

10. A device comprising:
a front-end structure comprising a substrate formed from a material selected from the group consisting of silicon, gallium arsenide, and silicon-on-insulator, an isolation structure in the substrate, an active device structure, one or more insulating spacers located adjacent the active device structure, and a dielectric layer over the active device structure; and
a back-end structure comprising a metal interconnect layer over the dielectric layer;
wherein the isolation structure optionally comprise a material exhibiting a dielectric constant less than 3.5, wherein the dielectric layer optionally comprises a material exhibiting a dielectric constant less than 3.5, and wherein one or more spacers comprise a material exhibiting a dielectric constant less than 3.5.

11. A device comprising a metal-oxide-silicon field effect transistor that comprises a front-end structure comprising a nanoporous silica that exhibits a dielectric constant less than 3.5.

12. The device of claim 11, wherein the dielectric material exhibits a dielectric constant less than 3.0.

13. The device of claim 11, wherein the nanoporous silica exhibits an average pore size less than 25 nm.

14. A device comprising:
- a front-end structure that comprises a substrate, an isolation structure in the substrate, an active device structure comprising a gate conductor, a gate dielectric, and a gate junction, one or more insulating spacers located adjacent the active device structure, and a dielectric layer over the active device structure; and
- a back-end structure that comprises a metal interconnect layer over the dielectric layer;
- wherein the dielectric layer, and at least one of the isolation structure and the one or more insulating spacer, comprises a material exhibiting a dielectric constant less than 3.5.

15. The device of claim 14, wherein the substrate is selected from silicon, gallium arsenide, and silicon-on-insulator.

16. The device of claim 14, wherein the material exhibits a dielectric constant less than 3.0.

17. The device of claim 14, wherein the material comprises a nanoporous silica.

18. A device comprising:
- a front-end structure comprising a substrate, an isolation structure in the substrate, an active device structure, one or more insulating spacers located adjacent the active device structure, and a dielectric layer over the active device structure; and
- a back-end structure comprising a metal interconnect layer over the dielectric layer;
- wherein the isolation structure and the one or more insulating spacers comprise a material exhibiting a dielectric constant less than 3.5, and wherein the dielectric layer optionally comprises a material exhibiting a dielectric constant less than 3.5.

19. The device of claim 18, wherein the dielectric layer comprises a material exhibiting a dielectric constant less than 3.5.

* * * * *